United States Patent
Jaskari et al.

(10) Patent No.: US 10,433,448 B2
(45) Date of Patent: Oct. 1, 2019

(54) ARRANGEMENT FOR OSCILLATION DAMPENING

(71) Applicant: VACON OY, Vaasa (FI)

(72) Inventors: Jukka Jaskari, Vaasa (FI); Osmo Miettinen, Vaasa (FI); Magnus Hortans, Sundom (FI); Stefan Strandberg, Vora (FI)

(73) Assignee: Vacon Oy, Vaasa (FI)

( * ) Notice: Subject to any disclaimer, the term of this patent is extended or adjusted under 35 U.S.C. 154(b) by 0 days.

(21) Appl. No.: 15/573,193

(22) PCT Filed: Apr. 26, 2016

(86) PCT No.: PCT/EP2016/059224
§ 371 (c)(1),
(2) Date: Nov. 10, 2017

(87) PCT Pub. No.: WO2016/180626
PCT Pub. Date: Nov. 17, 2016

(65) Prior Publication Data
US 2018/0098449 A1    Apr. 5, 2018

(30) Foreign Application Priority Data

May 13, 2015    (FI) ..................... 20155344

(51) Int. Cl.
 H02M 7/00    (2006.01)
 H05K 7/14    (2006.01)
 (Continued)

(52) U.S. Cl.
 CPC ............. *H05K 7/14* (2013.01); *H02G 5/02* (2013.01); *H02M 5/458* (2013.01); *H02M 7/003* (2013.01);
 (Continued)

(58) Field of Classification Search
 CPC .... H05K 7/14; H05K 7/20927; H05K 7/1432; H05K 5/04; H02M 5/458; H02G 5/02
 (Continued)

(56) References Cited

U.S. PATENT DOCUMENTS

| 2001/0014029 A1 | 8/2001 | Suzuki et al. |
| 2009/0002956 A1* | 1/2009 | Suwa ............... B60L 1/003 361/728 |

(Continued)

FOREIGN PATENT DOCUMENTS

| CN | 101252307 A | 8/2008 |
| EP | 1484954 A2 | 8/2004 |

(Continued)

OTHER PUBLICATIONS

International Search Report for PCT Serial No. PCT/EP2016/059224 dated Jul. 13, 2016.

*Primary Examiner* — Nguyen Tran
*Assistant Examiner* — Bryan R Perez
(74) *Attorney, Agent, or Firm* — McCormick, Paulding & Huber LLP

(57) ABSTRACT

Power electronics device, such as a frequency converter, comprising power units (REC1, INU1, INU2, CDC1), a metal frame (31) and a DC bus arrangement in which the power units are connected. The power units may be assembled inside the metal frame (31) wherein the shape of the metal frame is elongated with rectangular cross-sectional shape, consisting of a bottom part (33) and from that essentially vertical oriented side wall parts (32). The DC bus arrangement is arranged on top of the bottom part (33) of the metal frame (31) and separated by an insulator layer (S1) from the metal frame (31). The DC bus arrangement comprises a first DC bus current conductor (DC+) and a second DC bus current conductor (DC-) which are arranged apart from each other. The DC bus current conductors (DC+, (Continued)

DC−) have a flat shape in such a way that their thickness dimension is essentially shorter than their width dimension.

20 Claims, 3 Drawing Sheets

(51) Int. Cl.
　　　H05K 7/20　　　(2006.01)
　　　H02G 5/02　　　(2006.01)
　　　H02M 5/458　　(2006.01)
　　　H05K 5/04　　　(2006.01)

(52) U.S. Cl.
　　　CPC ............ *H05K 5/04* (2013.01); *H05K 7/1432* (2013.01); *H05K 7/20927* (2013.01)

(58) Field of Classification Search
　　　USPC .................................................. 363/141–147
　　　See application file for complete search history.

(56) References Cited

U.S. PATENT DOCUMENTS

| 2015/0029666 A1* | 1/2015 | Kosuga ............... H02M 3/28 361/699 |
| 2015/0305188 A1* | 10/2015 | Maeda ................ H05K 7/1432 361/728 |

FOREIGN PATENT DOCUMENTS

| EP | 1 971 195 A2 | 9/2008 |
| EP | 2 101 402 A2 | 9/2009 |
| EP | 2 346 152 A1 | 7/2011 |
| EP | 2 744 094 A2 | 6/2014 |
| EP | 2 744 316 A2 | 6/2014 |
| WO | 2014103517 A1 | 7/2014 |

* cited by examiner

ARRANGEMENT FOR OSCILLATION DAMPENING

CROSS-REFERENCE TO RELATED APPLICATIONS

This application is a National Stage application of International Patent Application No. PCT/EP2016/059224, filed on Apr. 26, 2016, which claims priority to Finnish Patent Application No. 20155344, filed on May 13, 2015, each of which is hereby incorporated by reference in its entirety.

TECHNICAL FIELD

The object of this invention is a structural arrangement of a power electronics device, more particularly of a frequency converter. More particularly the object of the invention is a structural arrangement of a liquid-cooled frequency converter, wherein a number of inverter units and capacitor filter units are connected to the same direct-current intermediate circuit.

BACKGROUND ART

The general development trend of power electronics devices, such as frequency converters, is an increase in power density. It is known in the art that handling of high power in a small-sized device requires effective cooling of the components handling the power, which best succeeds with liquid cooling, i.e. by transferring the dissipation power produced in the components via liquid circulating in the device out from the device.

For reasons of cost, liquid cooling is most often used only in high power devices, e.g. in frequency converters of over 100 kW. Owing to the limited performance of an individual power semiconductor component, at high powers they must be connected in parallel, either in such a way that there are a number of components in parallel in the same device or by connecting whole devices in parallel to supply the same load. Parallel connection of components in the same device is problematic particularly because each differently-powered device may require its own mechanical construction. For this reason, parallel connections of whole devices are generally used, which is more advantageous from the viewpoint of, inter alia, manufacturing and servicing.

A power electronics device may comprise of several interconnected mechanical units which may have different functionality and/or they may be connected in parallel. E.g. a frequency converter described in the present invention consists of at least one capacitive filter unit and at least one inverter unit which are connected to the same direct current circuit, called as DC bus in this document. The required capacitance for smoothing the DC bus voltage waveform is concentrated in the filter unit(s), but still a small local capacitance, connected to the same DC bus, is required also inside the inverter unit(s) in order to limit voltage spikes in switching situations and also in order to reduce emitted high frequency disturbance level.

A normal practice in the DC bus arrangement is to pursue minimum resistivity, in order to minimize power losses, and minimum inductivity, in order to reach good filtering functionality. It is well known that several interconnected capacitances, located at spaced-apart, form a resonant LC circuit due to the inductance which is always present in electrical conductors. A problem under these circumstances may be a high resonance current, which causes extra power losses and warms up components in the circuit. Particularly difficult this problem is if the resonance frequency is the same as the switching frequency of the inverter unit or a multiple of it.

SUMMARY

The aim of this invention is to achieve a new type of arrangement for the construction of a compact liquid-cooled power electronics device, more particularly a frequency converter, when a number of power units, belonging to the same apparatus, have been interconnected via a common DC bus. The aforementioned drawbacks can be avoided with the arrangement, and it is suited for use both when the power units are connected in parallel and also when they are used for different functions. The aim of the invention is achieved with an arrangement, which is characterized by a power electronics device, such as a frequency converter, comprising power units ($REC_1$, $INU_1$, $INU_2$, $C_{DC1}$), a metal frame and a DC bus arrangement in which the power units are connected, wherein the power units may be assembled inside the metal frame, and wherein the shape of the metal frame is elongated with rectangular cross-sectional shape, consisting of a bottom part and from that essentially vertical oriented side wall parts, wherein the DC bus arrangement is arranged on top of the bottom part of the metal frame and separated by an insulator layer (S1) from the metal frame, and the DC bus arrangement comprises a first DC bus current conductor (DC+) and a second DC bus current conductor (DC−) which are arranged apart from each other, wherein the DC bus current conductors (DC+, DC−) have a flat shape in such a way that their thickness dimension is essentially shorter than their width dimension. Other preferred embodiments of the invention are the objects of the dependent claims.

The characteristic principle of the present invention is that the current conducting elements, such as busbars, forming the DC bus, are arranged apart from each other and separated only by a thin insulating layer from a metal surface, advantageously from the frame of the housing.

In the solution of the invention the DC bus is arranged such that the high frequency currents in the DC bus induce eddy currents in the metal frame. The direction of the eddy currents are opposite to the DC bus currents, which phenomenon appears externally as a low serial inductivity of the DC bus.

Another effect of the eddy currents is that they cause power losses in the frame metal, which phenomenon appears externally as an extra serial resistance of the DC bus. As is well known, the penetration depth of the induced current is the shorter the higher is the frequency of the current. Due to this phenomenon, the resistance encountered by the current is the higher the higher is the frequency of the current component. A useful effect of the resistivity, induced by eddy currents, is the dampening of possible resonance oscillations in the DC bus current. The resonance may easily be provoked by the fast switching phenomena of inverter power semiconductor switches.

According to the present invention the oscillations in the DC bus are dampened using by constructive arrangements, exploiting induced eddy current phenomenon, which according to prior art design principles is normally considered harmful and thus is tried to be avoided. The arrangement allows very compact and low cost design without any external dampening components.

BRIEF DESCRIPTION OF THE DRAWINGS

In the following, the invention will be described in more detail by the aid of some examples of its embodiments with reference to the attached drawings, wherein.

DETAILED DESCRIPTION

Figure 1:
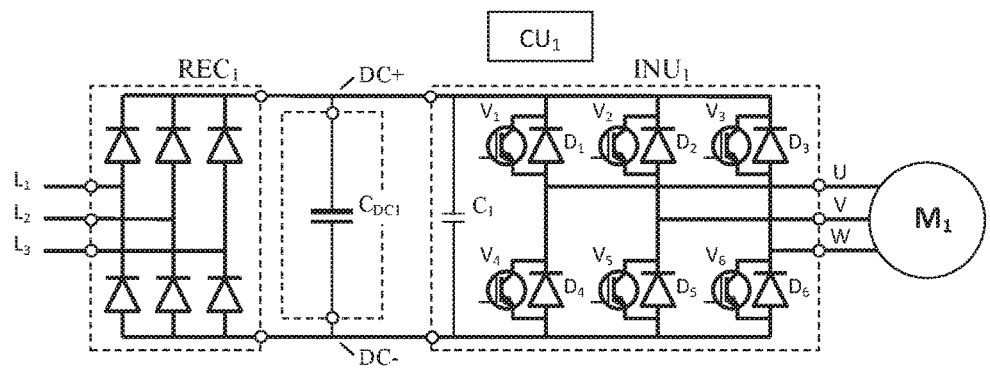
FIG. 1 presents the main circuit of a frequency converter drive.

FIG. 1 presents an embodiment of the main circuit of a normal three-phase PWM frequency converter, wherein a three-phase network bridge $REC_1$ comprised of diodes rectifies the three-phase mains voltage $L_1$, $L_2$, $L_3$ into the DC voltage of the intermediate circuit, which DC voltage has the poles DC+, DC− and which is filtered with a filtering capacitor $C_{DC1}$ functioning as an energy storage. A three phase inverter bridge $INU_1$, composed of power semiconductor components $V_1$-$V_6$, $D_1$-$D_6$, forms from the DC voltage of the intermediate circuit a three-phase output voltage U, V, W for controlling the motor $M_1$. The output voltage waveform consists of rectangular pulses, formed by the so-called phase switches (e.g. $V_1$, $D_1$, and $V_4$, $D_4$, in U-phase) which are able to connect the output phase terminals either to the positive pole or to the negative pole of the DC bus. The pulse frequency of the output voltage is called as the switching frequency. In modern frequency converters the fast power semiconductor components $V_1$ . . . $V_6$ are most generally IGBT transistors. For attenuating the switching phenomena produced by operation of the inverter, the inverter unit normally comprises also a capacitor $C_1$ disposed physically near the power components, which capacitor is normally significantly smaller in terms of its capacitance value than the energy storage $C_{DC1}$. The control unit $CU_1$ controls the operation of the device. An inductive component is normally connected to either side of the network bridge $REC_1$ for filtering the harmonics of the network current taken by the frequency converter (not drawn).

Figure 2:
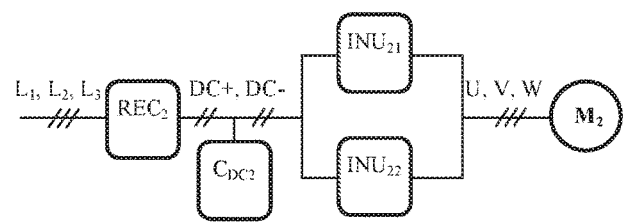
FIG. 2 presents the main circuit of a frequency converter drive.

FIG. 2 presents a single-line drawing of a high-powered frequency converter implementation, in which the power level requires a parallel connection of multiple devices. At high power the different functional parts of a converter are generally constructed in their own mechanical units, e.g. like in the figure where the capacitive filter unit $C_{DC2}$ functioning as an energy storage is common to several inverter units $NU_{21}$, $INU_{22}$, the output phases of which are connected together for supplying a common load motor $M_2$. In this kind of system, where the power modules may be located at a distance from each other, the correct filtering functionality of the DC circuit requires a DC bus with very low stray inductance between the units.

Figure 3:
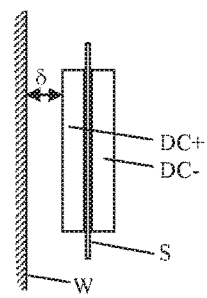
FIG. 3 presents the structure of a prior art DC busbar assembly.
Figure 4:
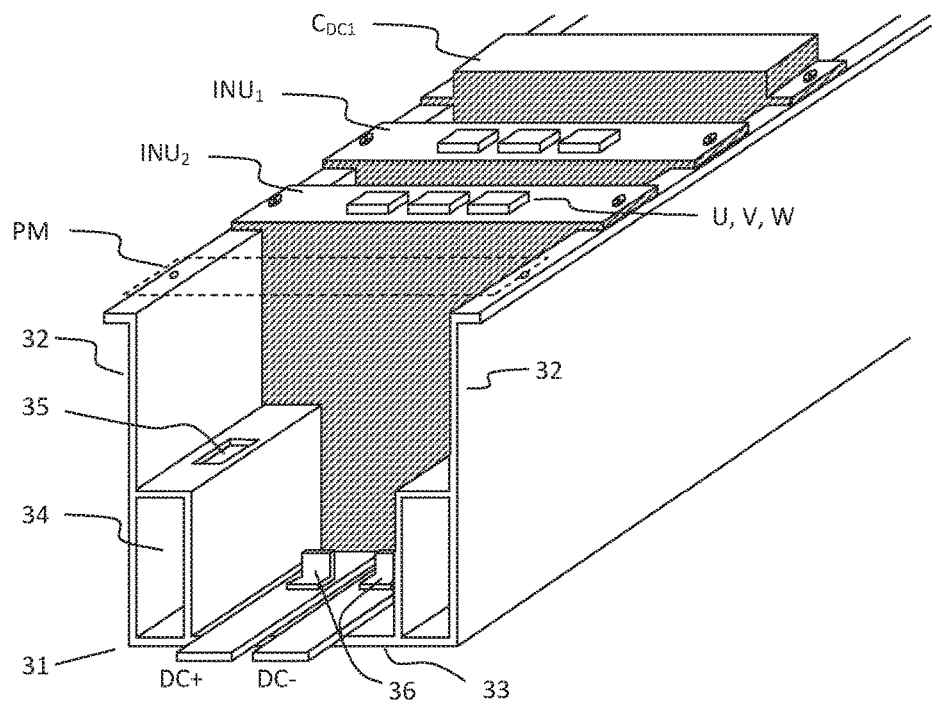
FIG. 4 presents the structure of a frequency converter according to the present invention.
Figure 5:
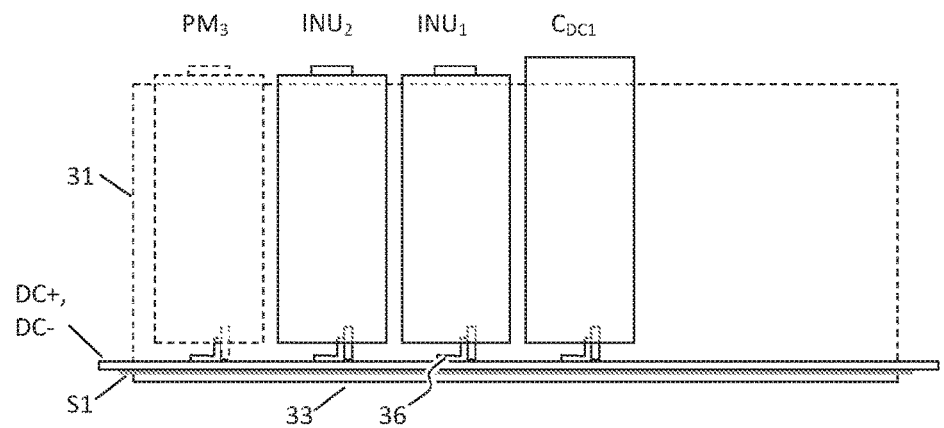
FIG. 5 presents the cross-sectional view of a frequency converter structure according to the present invention.

FIG. 3 presents an example of a mechanical structure of a prior art DC bus normally used in high power frequency converters (mechanical support structures not drawn). In the prior art arrangement the current conductors DC+, DC−, are flat busbars, assembled on top of each other and separated by a thin insulator layer S from each other. The self-inductance of this kind of a construction is very low and due to well conductive material, e.g. copper, its resistance and thus also power losses are low. Normally the busbar assembly is separated from grounded parts, e.g. from the metal wall W of the housing by an airgap δ of several millimeters, dimensioned according to proper safety standards FIG. 4 presents a perspective drawing of an example how the power modules may be assembled inside a liquid cooled frame 31, comprising of an elongated, rectangular profile, which may be e.g. aluminum, with a bottom part 33, from that essentially vertical oriented side wall parts 32 and liquid cooling channels 34. The frame includes a plurality of installation locations for power modules, which can be cooled by liquid via the openings 35 in the liquid channels (in the figure an empty location PM and power modules $INU_1$, $INU_2$ and $C_{DC1}$). According to one embodiment of the present invention DC busbars DC+, DC−, extending the chassis 31 from end to end and comprising connection parts 36 at each power module location, are arranged on top of the bottom part 33. According to one embodiment of the present invention the shapes of the DC busbars are flat, which means that their thickness dimension is essentially shorter than their width dimension, as seen from the bottom part 33 direction. FIG. 5 presents a cross-sectional side view of the embodiment of the arrangement presented in FIG. 4, highlighting especially how the intermediate circuit DC busbars DC+, DC−, are separated from the frame bottom part 33 only by a thin insulator layer S1. The shape of the insulator layer S1 is advantageously one common sheet for both DC busbars throughout the frame 31, or separate sheets for each busbar DC+, DC−. The thickness of the insulator layer is advantageously minimum that the insulating material allows in order to fulfill the requirements for sufficient mechanical strength and adequate insulation. According to one embodiment of the present invention the thickness of the insulation layer is less than 1 mm.

Figure 6:
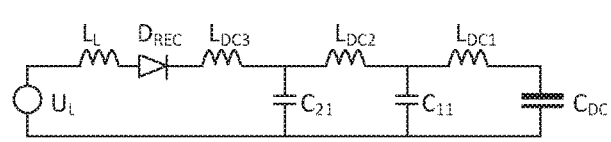
FIG. 6 presents the equivalent circuit of the DC circuit of a frequency converter.

FIG. 6 presents an equivalent single-line electric circuit of the DC bus arrangement according to the previous example. In the figure, $U_L$ depicts the supplying mains voltage, $L_L$ the mains filtering inductance and $D_{REC}$ the diode in the rectifier bridge. $L_{DC1}$ . . . $L_{DC3}$ symbolize the serial inductances of the DC current conductors, such as busbars, between the power modules and $C_{11}$, $C_{21}$ the internal capacitors of inverter units $INU_1$, $INU_2$, respectively. $C_{DC}$ symbolizes the capacitance of the actual capacitive filter unit $C_{DC1}$ in the DC bus. In the arrangement the distances between the power modules are equal, which means that also the inductances $L_{DC1}$ . . . $L_{DC3}$ are equal.

Figure 7:
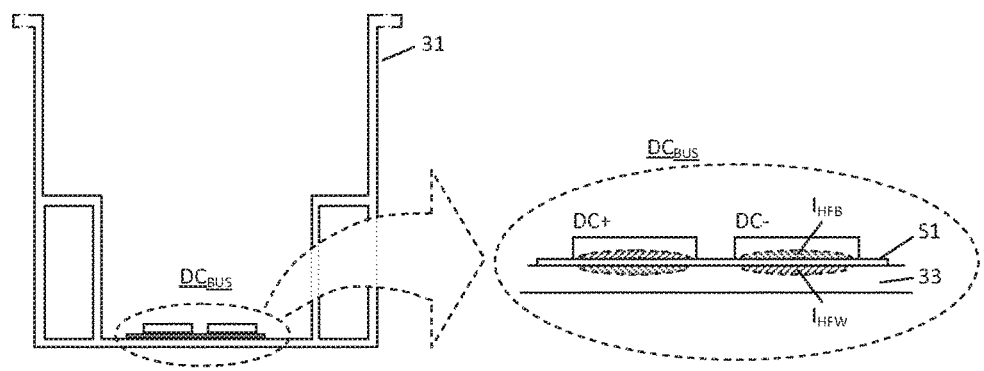
FIG. 7 presents the DC bus arrangement according to the present invention.

FIG. 7 presents a more detailed cross-sectional view on the DC bus arrangement according to one embodiment of the invention. In the embodiment of FIG. 7 the DC bus current conductors DC+, DC− are busbars which are lying side by side on the frame bottom part 33, separated only by a thin insulator layer S1 from it. In one embodiment of the invention one insulating layer or sheet can be arranged under both current conductors DC+, DC− as in the embodiment of FIG. 7. In another embodiment of the invention separate insulating layer or sheet elements can be used for insulating current conductors DC+, DC− from the metal frame. In this case it's possible to arrange one insulation layer or sheet under DC+ current conductor and another insulation layer or sheet under DC− current conductor. According to the basic rules of electrical engineering, the higher the frequency of the current is, the shorter is its penetration depth into the conductor. $I_{HFB}$ depicts an exemplary penetration of a high frequency current in the DC− conductor, and $I_{HFW}$ the corresponding penetration of the eddy current into the frame bottom 33, induced by the high frequency current in the DC− current conductors. As is well known, the eddy currents cause power losses, which phenomenon corresponds the effect of a serial resistance in the actual current conductor. Because the penetration depth rule mentioned above, the serial resistance is the higher the higher is the frequency. This phenomenon is demonstrated in the following table which gives the resistivity of an exemplary flat current conductor in the arrangement according to FIG. 7 (column new) and the same conductor in a prior art arrangement as depicted in FIG. 3 (column old) as a function of frequency f. The resistivity in column new is reached when the current conductor material is copper and frame material is aluminum. In the arrangement according to the present invention it is possible to affect to the resistivity by the frame material selection, unlike in prior art arrangement where only the current conductor material is decisive.

| Frequency | Resistivity [mW/m] | |
| --- | --- | --- |
| [kHz] | new | old |
| 0.01 | 0.05 | 0.04 |
| 0.1 | 0.09 | 0.06 |
| 1 | 0.33 | 0.20 |
| 10 | 1.22 | 0.67 |
| 100 | 4.07 | 2.15 |
| 1000 | 13.20 | 6.98 |

Figure 8:
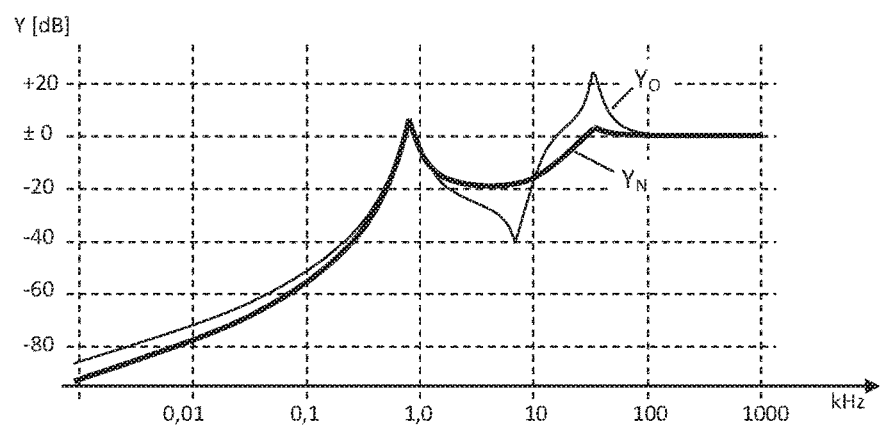
FIG. 8 illustrates currents of a capacitor connected in the DC bus of a frequency converter.

FIG. 8 illustrates the effect of the DC bus resistivity change as a function of frequency on the current amplification ratio Y in an exemplary DC bus arrangement according to the present invention (curve $Y_N$) and by using a prior art DC bus arrangement as presented in FIG. 3 (curve $Y_O$). The current amplification ratio is calculated by the formula 1:

$$Y = I_{DC}/I_{INU} \quad [1]$$

where $I_{DC}$ means the current of the internal DC bus capacitor of an inverter unit, and $I_{INU}$ means the current that an inverter unit INU supplies to the DC bus. The scale of the current amplification Y is logarithmic, so all values higher than 0 mean current amplification, which is harmful i.e. from the capacitor lifetime point of view. The first amplification peak at about 0.8 kHz is the effect of supplying mains circuit, and the second peak at about 30 kHz is the effect of a resonance within the DC bus circuit, due to stray inductances of the current conductors, INU module internal capacitances and main filtering capacitance. As can be seen from the FIG. 8, especially this amplification peak which is most harmful for the capacitors, reduces strongly due to the resistance effect caused by eddy currents in the arrangement according to the present invention. When the resonance frequency is known, it is advantageous to set the switching frequency of the inverter unit to a value where it or its multiple does not meet the resonance frequency peak of the DC bus arrangement.

While the invention has been described with reference to the previous embodiment, it should be recognized that the invention is not limited to this embodiment, but many modifications and variations will become apparent to persons skilled in the art without departing from the scope of the invention, as defined in the appended claims.

What is claimed is:

1. A power electronics device, such as a frequency converter, comprising power units (REC$_1$, INU$_1$, INU$_2$, C$_{DC1}$), a metal frame and a DC bus arrangement in which the power units are connected, wherein the power units are assembled inside the metal frame, and wherein the shape of the metal frame is elongated with rectangular cross-sectional shape, consisting of a bottom part and from that essentially vertical oriented side wall parts, wherein the DC bus arrangement is arranged on top of the bottom part of the metal frame and separated by an insulator layer (Si) from the metal frame, and the DC bus arrangement comprises a first DC bus current conductor (DC+) and a second DC bus current conductor (DC−) which are arranged side by side and apart from each other, wherein the DC bus current conductors (DC+, DC−) have a flat shape in such a way that their thickness dimension is essentially shorter than their width dimension;

and wherein the first DC bus current conductor (DC+) and the second DC bus current conductor (DC−) are only separated from the bottom part of the metal frame by a thickness of the insulator layer (Si).

2. The power electronics device according to claim 1, wherein the insulator layer (S1) is arranged such that one common insulator sheet is arranged under both DC bus current conductors (DC+, DC−) throughout the frame or separate insulator sheets are arranged under each DC bus current conductors (DC+, DC−).

3. The power electronics device according to claim 1, wherein the thickness of the insulator layer is minimum what is required to fulfill the requirements for sufficient mechanical strength and adequate insulation.

4. The power electronics device according to claim 1, wherein the thickness of the insulation layer (S1) is less than 1 mm.

5. The power electronics device according to claim 1, wherein switching frequency of inverter unit (INU$_1$, INU$_2$) included in the power units is set to a value where the switching frequency or its multiple does not meet the resonance frequency peak of the DC bus arrangement.

6. The power electronics device according to claim 1, wherein the first DC bus current conductor (DC+) and the second DC bus current conductor (DC−) are busbars.

7. The power electronics device according to claim 1, wherein the first DC bus current conductor (DC+) and the second DC bus current conductor (DC−) are arranged to extend from one end of the metal frame to the other end of the metal frame.

8. The power electronics device according to claim 1, wherein the first DC bus current conductor (DC+) and the second DC bus current conductor (DC−) comprise connection parts for power modules.

9. The power electronics device according to claim 2, wherein the thickness of the insulation layer (S1) is less than 1 mm.

10. The power electronics device according to claim 3, wherein the thickness of the insulation layer (S1) is less than 1 mm.

11. The power electronics device according to claim 2, wherein the first DC bus current conductor (DC+) and the second DC bus current conductor (DC−) are busbars.

12. The power electronics device according to claim 3, wherein the first DC bus current conductor (DC+) and the second DC bus current conductor (DC−) are busbars.

13. The power electronics device according to claim 4, wherein the first DC bus current conductor (DC+) and the second DC bus current conductor (DC−) are busbars.

14. The power electronics device according to claim 5, wherein the first DC bus current conductor (DC+) and the second DC bus current conductor (DC−) are busbars.

15. The power electronics device according to claim 2, wherein the first DC bus current conductor (DC+) and the second DC bus current conductor (DC−) are arranged to extend from one end of the metal frame to the other end of the metal frame.

16. The power electronics device according to claim 3, wherein the first DC bus current conductor (DC+) and the second DC bus current conductor (DC−) are arranged to extend from one end of the metal frame to the other end of the metal frame.

17. The power electronics device according to claim 4, wherein the first DC bus current conductor (DC+) and the second DC bus current conductor (DC−) are arranged to extend from one end of the metal frame to the other end of the metal frame.

18. The power electronics device according to claim 5, wherein the first DC bus current conductor (DC+) and the second DC bus current conductor (DC−) are arranged to extend from one end of the metal frame to the other end of the metal frame.

19. The power electronics device according to claim 6, wherein the first DC bus current conductor (DC+) and the second DC bus current conductor (DC−) are arranged to extend from one end of the metal frame to the other end of the metal frame.

20. The power electronics device according to claim 2, wherein the thickness of the insulator layer is minimum what is required to fulfill the requirements for sufficient mechanical strength and adequate insulation.

\* \* \* \* \*